United States Patent
Hartman et al.

(10) Patent No.: US 8,427,331 B2
(45) Date of Patent: Apr. 23, 2013

(54) SYSTEM AND METHOD FOR TESTING POWER TRANSISTORS

(75) Inventors: Mark E. Hartman, Peoria, IL (US); James D. Siegle, Peoria, IL (US); Thuong D. Le, Edwards, IL (US); Bruce H. Hein, East Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 804 days.

(21) Appl. No.: 12/634,141

(22) Filed: Dec. 9, 2009

(65) Prior Publication Data

US 2010/0164735 A1 Jul. 1, 2010

Related U.S. Application Data

(60) Provisional application No. 61/141,891, filed on Dec. 31, 2008.

(51) Int. Cl.
*G08B 21/00* (2006.01)

(52) U.S. Cl.
USPC ............ 340/653; 340/657; 340/635; 324/500

(58) Field of Classification Search ................... 340/653
See application file for complete search history.

(56) References Cited

U.S. PATENT DOCUMENTS

| | | | |
|---|---|---|---|
| 4,896,242 A | 1/1990 | Neft | |
| 5,481,194 A | 1/1996 | Schantz et al. | |
| 5,978,195 A | 11/1999 | Goder et al. | |
| 6,097,582 A | 8/2000 | John et al. | |
| 6,145,107 A | 11/2000 | Farokhzad | |
| 6,724,313 B2* | 4/2004 | Sato et al. | 340/590 |
| 6,836,125 B2* | 12/2004 | Breit et al. | 324/557 |
| 6,900,997 B2 | 5/2005 | Perreault et al. | |
| 6,927,988 B2 | 8/2005 | Cheng et al. | |
| 7,219,022 B2 | 5/2007 | Wekhande | |
| 7,486,099 B1* | 2/2009 | Manika | 324/762.08 |
| 2004/0095787 A1 | 5/2004 | Donaldson et al. | |

* cited by examiner

*Primary Examiner* — Kerri McNally

(57) ABSTRACT

A method for testing a power converter having at least one power transistor is disclosed. The method may include receiving a power transistor test request, and resetting a fault flag. The method may also include applying a gate driver signal to each power transistor, receiving a feedback signal from each power transistor, and determining a difference between the gate driver signal and the feedback signal associated with a respective power transistor. The method may further include identifying a fault if the difference exceeds a threshold profile, and setting a fault flag when a fault is identified.

28 Claims, 6 Drawing Sheets

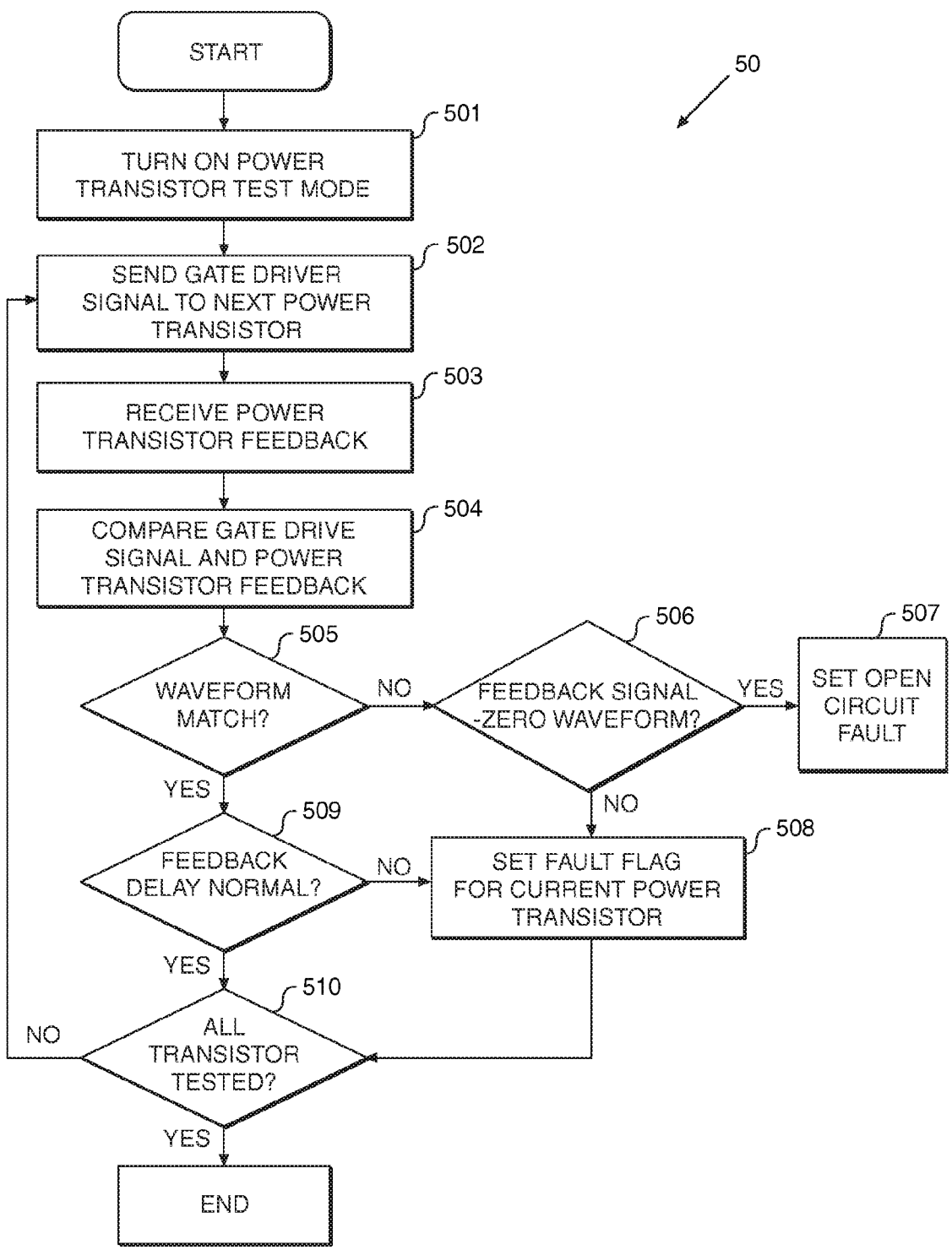

SYSTEM AND METHOD FOR TESTING POWER TRANSISTORS

CLAIM FOR PRIORITY

This application claims priority from U.S. Provisional Application No. 61/141,891, filed on Dec. 31, 2008, which is incorporated by reference herein.

TECHNICAL FIELD

This application relates to a system and method for testing electrical devices, and more particularly, to a system and method for testing power transistors.

BACKGROUND

Power converters/inverters are commonly used in a machine for motor control. Power converters/inverters usually include a plurality of power transistors, and these power transistors may be switched on and off to modulate an output voltage from the power converter/inverter. Examples of power transistors may include bipolar junction transistors (BJT), the Darlington device, metal oxide semiconductor field effect transistors (MOSFET), and insulated gate bipolar transistors (IGBT). In particular, IGBTs have been widely used in a wide range of applications due to its high switching speed and ability of conducting very high current.

High voltage power converters/inverters are usually expensive, and failure of power transistor components could be costly. Additionally, in the event that there is a malfunction in the power transistors or their wiring, damage may be caused to the other power components in the circuit. Therefore, it becomes highly desirable that any faults with power transistors, their driving circuit, and associated wiring are detected before high voltage is applied to the power converters/inverters. Furthermore, it may also be important to precisely and quickly locate the type of fault (e.g., a power transistor fault, an open circuit fault), and if possible, positions of the fault, and to disable the inverter/converter functionality once a fault is detected.

A method for diagnosing faults in IGBTs is described in U.S. Pat. No. 6,927,988 to Cheng et al. ("the '988 patent"). The '988 patent describes a method for detecting and locating a faulted IGBT using a load. In the method, the output of a power inverter is connected to a three-phase resistor load having a common resister value, and a voltage is applied on the power inverter. IGBTs are controlled such that certain currents flow across them, and the currents are measured and compared with their expected values. If the currents do not match their expected values, a fault may be detected and diagnosed.

Although the testing method described in the '988 patent may be effective for testing IGBT devices associated with a power inverter, it may be problematic. For example, the IGBT test described in the '988 patent requires that a power source be connected to the power inverter to supply power to the power inverter, and a circuit is formed to conduct a current flow among the power source, the power inverter, and a load. As a result, other power electronics components connected in the circuit as well as the load (for example, a motor) may be damaged due to IGBT failure and/or wiring faults. Thus, it may not be capable of detecting and locating a fault before high-voltage is applied. Furthermore, although the testing method described in the '988 patent may indicate whether a fault exists, it may be incapable of disabling the inverter/converter functionality, once a fault is detected.

The disclosed system and method for testing power transistors is directed towards overcoming one or more of the shortcomings set forth above.

SUMMARY

In one aspect, a method for testing a power converter having at least one power transistor is disclosed. The method may include receiving a power transistor test request, and resetting a fault flag for each power transistor, wherein the fault flag indicates a fault status associated with a corresponding power transistor. The method may also include applying a gate driver signal to each power transistor, receiving a feedback signal from each power transistor, and determining a difference between the gate driver signal and the feedback signal associated with a respective power transistor. The method may further include identifying a power transistor fault if the difference exceeds a threshold profile, and setting the fault flag for the power transistor on which a power transistor fault is identified.

In another aspect, a power transistor testing system is disclosed. The power transistor testing system may include a controller electrically coupled to a power converter. The controller may be configured to reset a fault flag for each power transistor, wherein the fault flag indicates a fault status associated with a corresponding power transistor. The controller may also be configured to apply a gate driver signal to each power transistor, receive a feedback signal from each power transistor, and determine a difference between the gate driver signal and the feedback signal associated with a respective power transistor. The controller may be further configured to identify a power transistor fault if the difference exceeds a threshold profile, and set the fault flag for the power transistor on which a power transistor fault is identified. The power transistor testing system may further include a display device coupled to the controller, and be configured to provide at least one warning indication in the event of a power transistor fault.

In another aspect of the disclosure, a method for testing a power converter having at least one power transistor is disclosed. The method may include receiving a power transistor test request, and resetting a fault flag for each power transistor, wherein the fault flag indicates a power transistor fault status associated with a corresponding power transistor. The method may also include applying a gate driver signal to each power transistor, receiving a feedback signal from each power transistor, and determining a difference between the gate driver signal and the feedback signal associated with a respective power transistor. The method may further include determining whether the feedback signal received is a non-zero waveform over a predetermined period of time.

In a further aspect, a power transistor testing system is disclosed. The power transistor testing system may include a controller electrically coupled to a power converter. The controller may be configured to reset a fault flag for each power transistor, wherein the fault flag indicates a power transistor fault status associated with a corresponding power transistor. The controller may also be configured to apply a gate driver signal to each power transistor, receive a feedback signal from each power transistor, determine a difference between the gate driver signal and the feedback signal associated with a respective power transistor, and determine whether the feedback signal received is a non-zero waveform over a predetermined time. The controller may be further configured to identify a power transistor fault if the difference exceeds a threshold profile and the feedback signal received is a non-zero waveform over the predetermined period of time. The controller may set the fault flag for the power transistor on which a power transistor fault is identified. The power transistor testing system may further include a display device coupled to the controller, and be configured to provide at least one warning indication in the event of a power transistor fault.

BRIEF DESCRIPTION OF THE DRAWINGS

FIG. 5 provides a diagrammatic illustration of an exemplary power transistor test process during a power converter test of FIG. 3, in accordance with an embodiment of the present disclosure;

DETAILED DESCRIPTION

Figure 1:
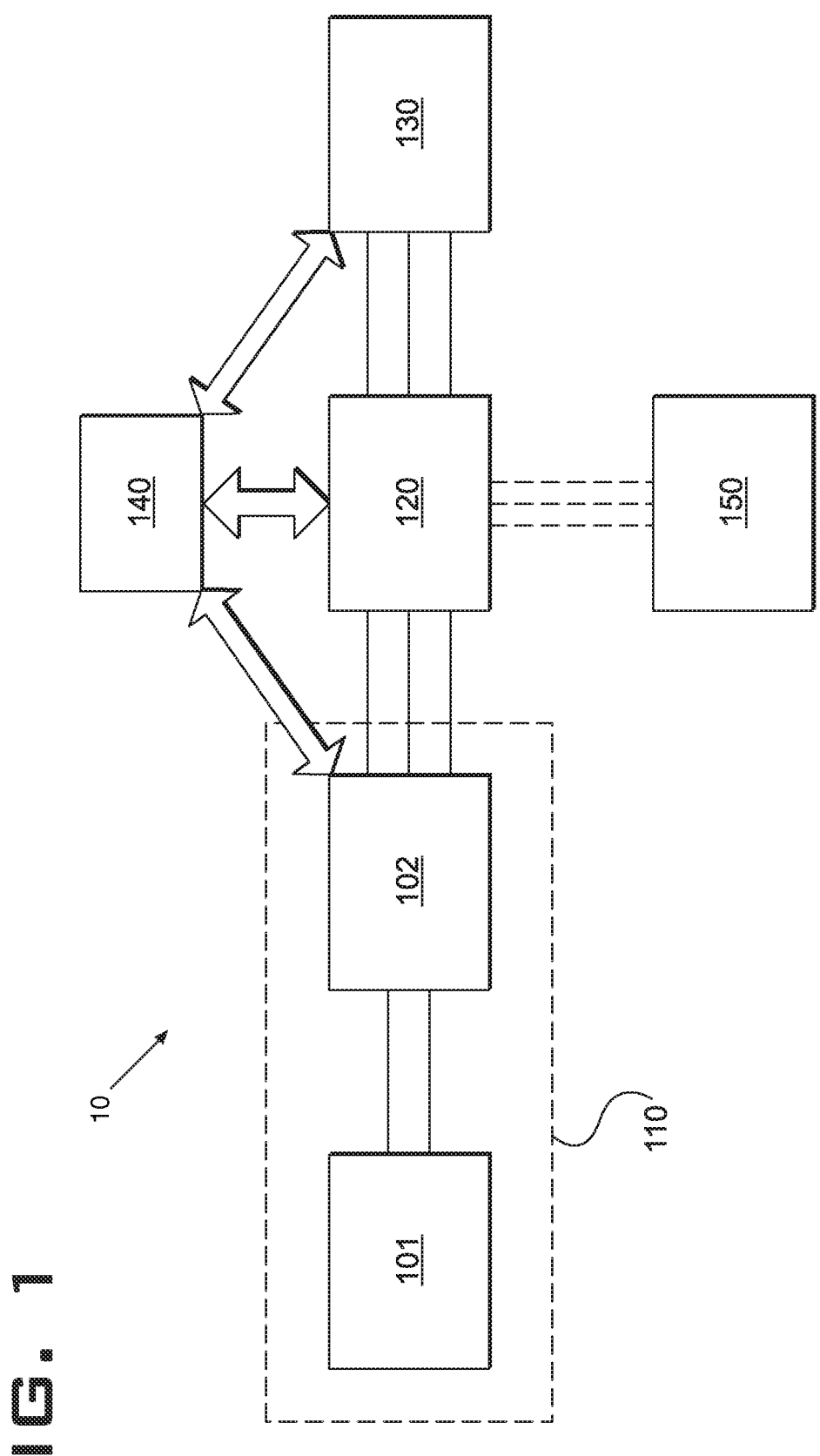
FIG. 1 provides a block diagram of a machine in accordance with an exemplary embodiment of the present disclosure.

FIG. 1 provides a block diagram of a machine in accordance with an exemplary embodiment of the present disclosure. Machine 10 may include, among other things, a power source 110, a power electronics system 120, a traction system 130, a control system 140, and a power transistor testing system 150. Machine 10, as the term is used herein, refers to a fixed or mobile machine that may perform some-type of operation associated with a particular industry, such as mining, construction, farming, etc., and that operates between or within work environments. Examples of machines include trucks, cranes, earth moving vehicles, mining vehicles, backhoes, material handling equipment, fanning equipment, marine vessels, and on-highway vehicles.

Power source 110 may include various components configured to provide electric power for use by one or more systems of machine 10. Power source 110 may include a prime mover 101 and a generator 102 driven by prime mover 101. Prime mover 101 may be a combustion engine, such as, for example, a diesel engine. Generator 102 may be an AC generator, otherwise known as an alternator, which generates alternating voltage by rotating a coil in the magnetic field or by rotating a magnetic field within a stationary coil. Alternatively, power source 110 may include any other suitable device for providing an electrical power output such as, for example, a battery, a fuel cell, switched reluctance machine, or any other type of power source configured to provide electrical power to machine 10.

Power electronics system 120 may be electrically coupled to power source 110 via a first set of conductors, and to traction system 130 via a second set of conductors. Traction system 130 may include at least one load, such as an electric motor. Power electronics system 120 may be configured to convert power provided by power source 110 into power forms appropriate for consumption by traction system 130. Power electronics system 120, for example, may include a power rectifier to convert AC voltage supplied by power source 110 to a DC voltage output, and may further include a power inverter to convert the DC voltage to an AC voltage of a certain waveform. Power electronics system 120 may provide voltage and/or current outputs to drive traction system 130 and/or control system 140.

Power electronics system 120 may include at least one power converter. Each power converter may have at least one phase and each phase may include at least one power transistor. Each power transistor may be switched on and off by its corresponding gate driving circuit. For the purpose of illustration, IGBT testing will be discussed in the present disclosure. However, it is contemplated that the disclosed system and method may be applicable to other suitable power transistors including, but not limited to, BJT, the Darlington device, and MOSFET.

The power transistors may be switched according to a switching scheme, such as a pulse width modulation (PWM), to modulate the voltage that is output from the power converter. Control system 140 may be coupled to power electronics system 120 and configured to provide gate driving signals to the power transistors based on a pre-programmed switching scheme. Control system 140 may also be coupled to traction system 130, and/or power source 110 to perform one or more control functions. Control system 140 may further be configured to receive feedback from a plurality of points in the circuit and adjust the control signals based on the feedback.

When high voltage is applied to machine 10, failures of the power transistors in power electronics system 120, their gate driving circuits, and/or mistakes in the wiring, may cause malfunctions in the circuit, such as overcurrent, which may damage other power components connected in the circuit. For example, power source 110 and/or traction system 130 may contain highly sensitive electronic circuits, which may be damaged by overcurrent. To detect the power transistor faults before high voltage is applied to the power electronics system 120, a power transistor testing system 150 for testing power transistors may be included.

Power transistor testing system 150 may be included as an integral part of power electronics system 120 and control system 140. Alternatively, power transistor testing system 150 may be external to these systems, for example, as part of a separate electronic control module (ECM) associated with machine 10. Power transistor testing system 150 may be electrically coupled to power electronics system 120 and configured to test the at least one power transistor associated with power electronics system 120. For example, power transistor testing system 150 may be configured to test power transistors in a power converter/inverter, and alternatively, it may also be configured to test power transistors in any part of power electronics system 120 such as a power transistor in a brake chopper circuit.

Power transistor testing system 150 may be configured to receive a power transistor test request conduct a test on the at least one power transistor associated with power electronics system 120, and notify a user of machine if any power transistor fault exists. According to one embodiment, power transistor testing system 150 may be configured to reset a fault flag for each power transistor associated with power electronics system 120, wherein the fault flag indicates a fault status associated with the corresponding power transistor. Power transistor testing system 150 may also be configured to apply a gate driver signal to each power transistor associated with power electronics system 120, receive a feedback signal from each power transistor, and determine a difference between the gate driver signal and the feedback signal associated with the same power transistor. Power transistor testing system 150 may be further configured to identify a power transistor fault if the difference exceeds a threshold profile, and set the fault flag for the power transistor on which a power transistor fault is identified. Power transistor testing system 150 may further provide at least one warning indication in the event of a power transistor fault.

Figure 2:
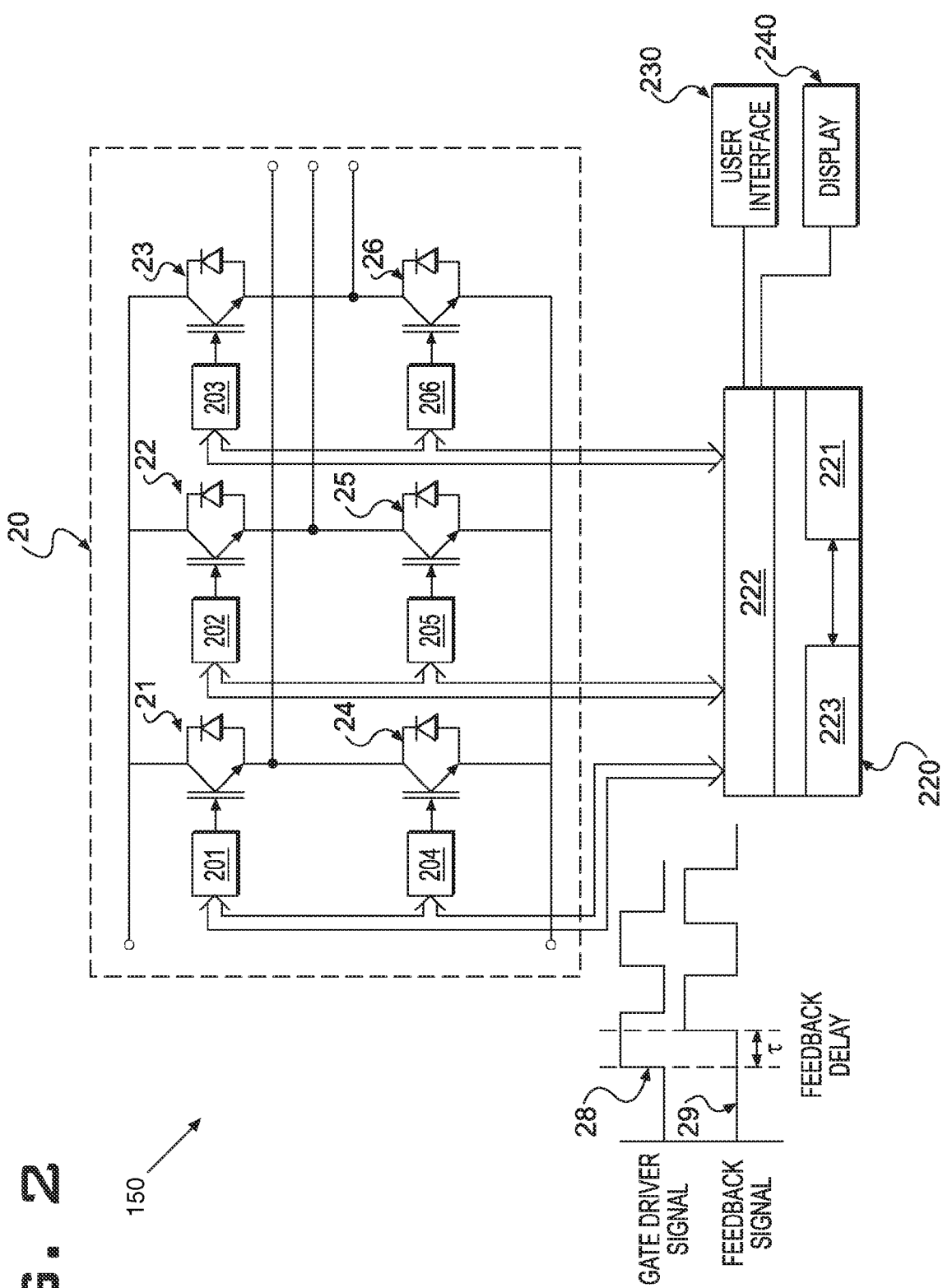
FIG. 2 provides a diagrammatic illustration of a power transistor testing system, in accordance with an exemplary embodiment of the present disclosure.

FIG. 2 provides a diagrammatic illustration of a power transistor testing system, in accordance with an exemplary embodiment of the present disclosure. As illustrated in FIG. 2, power transistor testing system 150 may be coupled to a power inverter 20 to test at least one power transistor. Power inverter 20 may have at least one phase and each phase may include at least one power transistor. Power inverter 20 may switch the plurality of power transistors on and off to output currents in only selected phases according to a pre-defined switching scheme. For example, as shown in FIG. 2, power inverter 20 may have three phases and each phase may have two IGBTs, including IGBTs 21-26.

It is complementary that power transistor testing system 150 may also be coupled to any components of power electronics system 120 other than power inverter 20, and be configured to test any power transistors in those components. Power electronics system 120 may include an IGBT (not shown) for regarding purpose in a brake chopper circuit. The retarding IGBT may be configured to switch on and off to control the amount of power sent from power electronics system 120 to a DC bus.

IGBT is a three-terminal power semiconductor device, which includes a gate terminal, an emitter terminal, and a collector terminal. P-N junctions are formed among these three terminals. These P-N junctions are normally blocked (i.e., non-conducting). When the voltage applied on a P-N junction is higher than a threshold value, the P-N junction will conduct a current flow, and accordingly, the IGBT is switched-on.

Each IGBT may be electrically connected to a gate driving circuit. For example, a gate driving circuit 201 may be connected to the gate of IGBT 21. Gate driving circuits 201-206 may be configured to apply a gate voltage across the gate to emitter terminals of the IGBTs. For example, gate driving circuit 201 may apply a gate driver signal 28 to the gate terminal of IGBT 21. In response to the rising edges of gate driver signal 28, the gate to emitter voltage on IGBT 21 may rise in an exponential fashion due to the circuit gate resistance and the gate to emitter capacitance, and meanwhile, drain current may increase linearly. When the voltage reaches a threshold value, IGBT 21 is switched-on and may conduct a drain current to be delivered to a load. When IGBT 21 is properly switched on, its gate terminal may send a feedback signal 29 back to gate driving circuit 201. Feedback signal 29 may replicate gate driver signal 28, except for a feedback delay τ. Power transistor testing system 150 may utilize gate driver signal 28 and its corresponding feedback signal 29 to test IGBTs 21-26.

Power transistor testing system 150 may include, among other things, a controller 220, a user interface 230, and a display device 240. Controller 220 may be coupled to power inverters 20 and configured to control each of gate driving circuits 201-206 to provide gate driver signal 28 during a power transistor test, and receive feedback signal 29 from each of IGBTs 21-26. Controller 220 may be configured to compare gate driver signal 28 and feedback signal 29 and determine whether a fault exists in any of IGBTs 21-26.

According to one embodiment, controller 220 may be coupled to a user interface 230 to receive a test request from a user. According to another embodiment, controller 220 may also be coupled to control system 140 in FIG. 1 to receive a test request at "key-on". Controller 220 may be further coupled to a display device 240 to display the test results.

Controller 220 may include, among other things, a storage unit 221, a communication unit 222, and a processing unit 223. These three units may be configured to transfer data and send or receive instructions between or among each other. Storage unit 221 may include a memory device such as, for example, a hard disk, a flash drive or a RAM, and may be configured to store threshold profiles containing threshold values of IGBTs 21-26. The profile of each IGBT may be stored as a look-up table in storage unit 221. Each threshold may be a value or a range of values. Each threshold may be in a form of absolute value or a percentage value. For example, the threshold profile may include a threshold of waveform difference and a threshold of delay time, for each IGBT. Storage unit 221 may also be configured to store a fault flag for each IGBT. The fault flag may indicate a fault status associated with the corresponding IGBT.

Communication unit 222 may include an analog to digital converter (ADC), a data buffer, and a control signal generating device. Communication unit 222 may be coupled to power inverter 20 and configured to communicate with gate driving circuits 201-206 and receive feedback signals. Communication unit 222 may be further configured to generate power converter switching control signals and send the signals to gate driving circuits 201-206 in power inverters 20. Communication unit 222 may also be coupled to the user interface 230 and configured to receive a test request from a user. Alternatively, communication unit 222 may be coupled to control system 140 to receive an automatically generated test request. Communication unit 222 may send the test request to processing unit 223.

Processing unit 223 may include a processing device and a data buffer. The processing device may be, for example, a CPU, a microprocessor, or a digital signal processor (DSP). Processing unit 223 may be configured to receive a test request from communication unit 222, and communicate with storage unit 221 to reset the fault flag for each IGBT stored therein. Processing unit 223 may be further configured to process the test request, generate a test plan for IGBTs 21-26 in power inverter 20, and send the test plan to communication unit 222. For example, the test plan may include an order in which IGBTs 21-26 may be tested, and a plurality of parameters for constructing gate driver signal 28. IGBTs 21-26 may be tested sequentially one after another, or alternatively, IGBTs 21-26 may be tested simultaneously.

Processing unit 223 may also be configured to receive feedback signal 29 from communication unit 222, and obtain threshold profiles from storage unit 221. Processing unit 223 may be configured to compare the feedback signal 29 to gate driver signal 28, and determine a difference between them. Processing unit 223 may be further configured to compare the difference with the threshold profile of the corresponding IGBT, and identify a power transistor fault if the difference exceeds the threshold profile. Processing unit 223 may be further configured to set the fault flag for the power transistor on which a power transistor fault is identified.

The processing unit 223 may store diagnostic software that can be executed to perform diagnosis when a fault is detected and determine a fault type and a location of the fault. For example, the fault may be a power transistor fault, such as a switching failure, or a driving circuit fault. The fault may also be a wiring fault, for example, gate driving circuit 201 may be mistakenly connected to IGBT 22. The processing unit 223 may be further configured to generate a test report having a fault advisory message, and send the test report to communication unit 222. The fault advisory may contain the type and location of the fault. Communication unit 222 may be further coupled to the display device 240 and configured to receive a test report from processing unit 223 and send the test report to the display device 240.

Processing unit 223 may also be configured to determine protective actions to be performed and send an instruction for executing the protective actions to communication unit 222. For example, in the event of a power transistor failure, the processing unit 223 may send an instruction to switch off all power transistors in power inverter 20 and disable the normal operation of power inverter 20. For example, PWM switching function may be disabled on power inverter 20 until the fault is cleared.

User interface 230 may be a computer, an operator console, or a handheld operator panel. User interface 230 may be coupled to controller 220 via communication cables, wireless networks, or other communication mediums. User interface 230 may include graphic interface for user input and a processor for generating a test request. User interface 230 may include a keyboard, a switch, a mouse, and/or a touch screen. User interface 230 may be configured to generate a test request based on the user inputs, and send the test request to communication unit 222.

Display device 240 may be, for example, a computer, an operator panel, or an LCD. According to one embodiment, display device 240 may be an integral part of user interface 230. Display device 240 may be coupled to controller 220 via communication cables, wireless networks, or other communication mediums. Display device 240 may be configured to receive and display a test report. Display device 240 may further include an audio unit and provide an audible indication when at least one fault is included in the test report.

INDUSTRIAL APPLICABILITY

Although the disclosed embodiments are described in association with a power transistor testing system for a power electronics system in a machine, the disclosed testing system may be used in any environment where it may be desirable to test an electric component that provides a feedback signal in response to a testing signal, detect a fault associated with the electric component, and provide a diagnostic signal for reporting the fault. Specifically, the disclosed testing system may apply a testing signal to an electric component, and receive a feedback signal from the electric component. The disclosed testing system may compare the testing signal and the feedback signal and determine a difference between them. The difference may be compared to a threshold profile, and a fault may be identified if the difference exceeds the threshold profile. The disclosed testing system may also be configured to diagnose the fault and provide a test report to a user.

Figure 3:
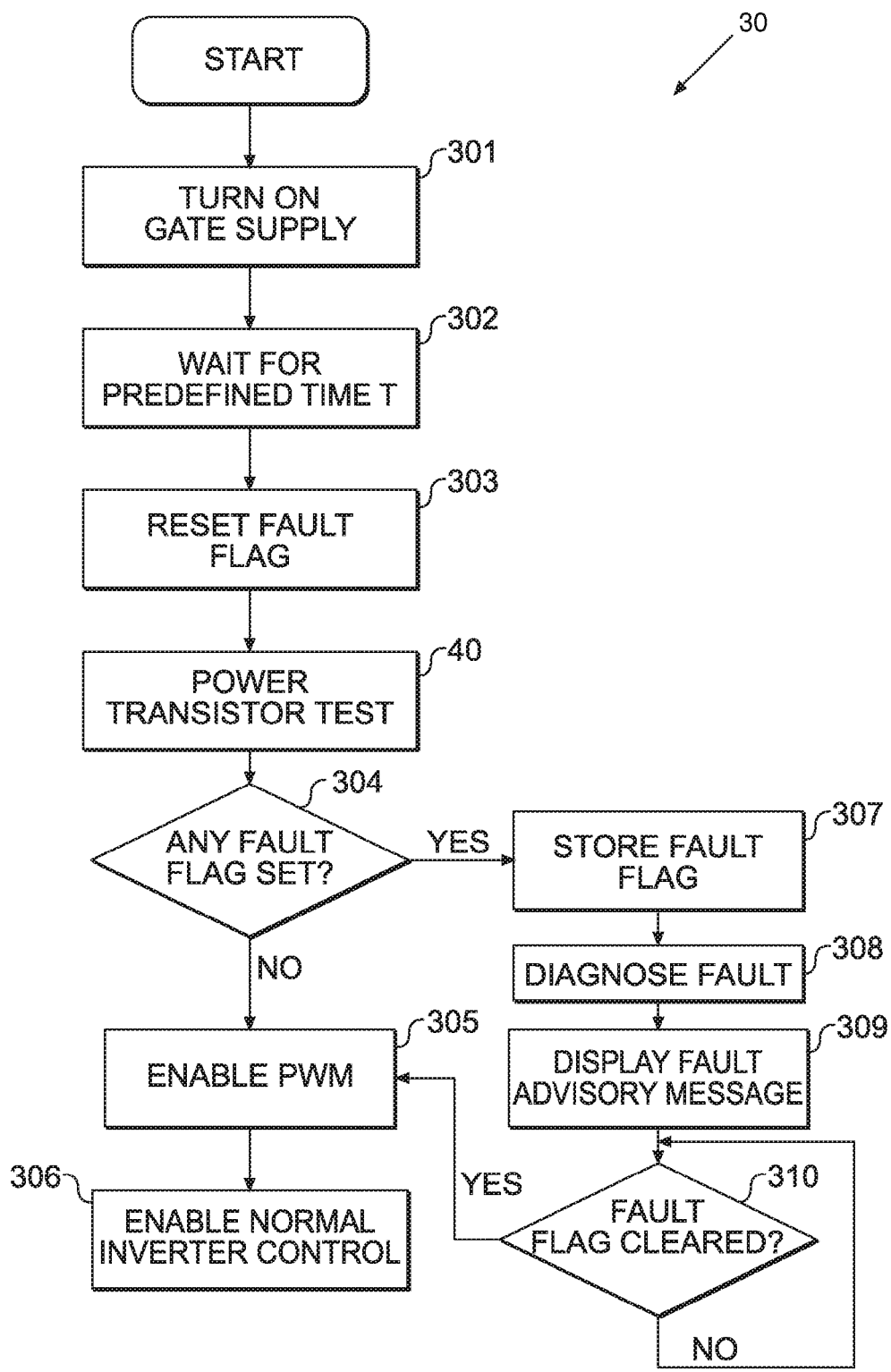
FIG. 3 provides a flowchart of an exemplary power converter test process, in accordance with an embodiment of the present disclosure.

FIG. 3 provides a flowchart of an exemplary operation process 30 of a power converter test, in accordance with an embodiment disclosed in FIG. 2. After a test request is received, controller 220 may be configured to turn on gate supplies of IGBTs 21-26 in power inverter 20 (step 301), and wait for a predefined time T (step 302). Controller 220 may further operate to reset fault flags of IGBTs 21-26 (step 303). All the fault flags may be cleared after the resetting so that any fault flag set after the test indicates a fault. Controller 220 may then operate to conduct a power transistor test and set the corresponding fault flag if a power transistor fault is detected. An exemplary operation process 40 of a power transistor test will be discussed in greater detail below with reference to FIG. 4.

After the power transistor test, controller 220 may be configured to determine whether any fault flag is set during the test (Step 304). If no fault flag is set (Step 304: No), controller 220 may be configured to enable the PWM switching operation of power inverter 20 (Step 305) and other normal inverter operations (Step 306). If at least one fault flag is set (Step 304: Yes), controller 220 may be configured to store the fault flags in storage unit 221 (Step 307). The fault flags may also be sent to a central control console via a network for records and further analysis.

Process 30 may include step 308 that diagnoses the faults. Controller 220 may be configured to determine the type and location of the faults. A detected fault may be determined as a power transistor fault, an open circuit fault (e.g., indicating a wire harness fault), or a combination thereof. For example, if a gate driver signal 28 is applied to IGBT 21, but a corresponding feedback signal 29 is received from gate driving circuit 206, a wiring fault may be suggested. For another example, if no feedback signal 29 is received in response to gate driver signal 28 after a certain time period, a power transistor switching failure may be suggested. If a power transistor fault is identified, the location of the fault, i.e., the specific power transistor on which the fault occurs may be determined too.

After the diagnosis, a test report having an advisory message may be generated. The test report may include a header, a summary of power transistors tested, a summary of faults, and a description of the fault locations. Controller 220 may be configured to send the test report for display on display device 240 (Step 309). The test report may be displayed as a text file, or alternatively, the test report may also be displayed as a diagrammatic chart including a configuration of power inverter 20, graphic views of individual IGBTs 21-26 and gate driving circuit 201-206 in power inverter 20, and fault locations marked in a notable manner.

A user of machine 10 may service the machine and fix the power transistor problem, based on the test report. The user may manually clear the fault flag via user interface 230 when the problem is solved. Controller 220 may be configured to monitor whether the set fault flag(s) are cleared (Step 310). If all the fault flags are cleared (Step 310: Yes), controller 220 may be configured to execute Step 305 and Step 306.

Figure 4:
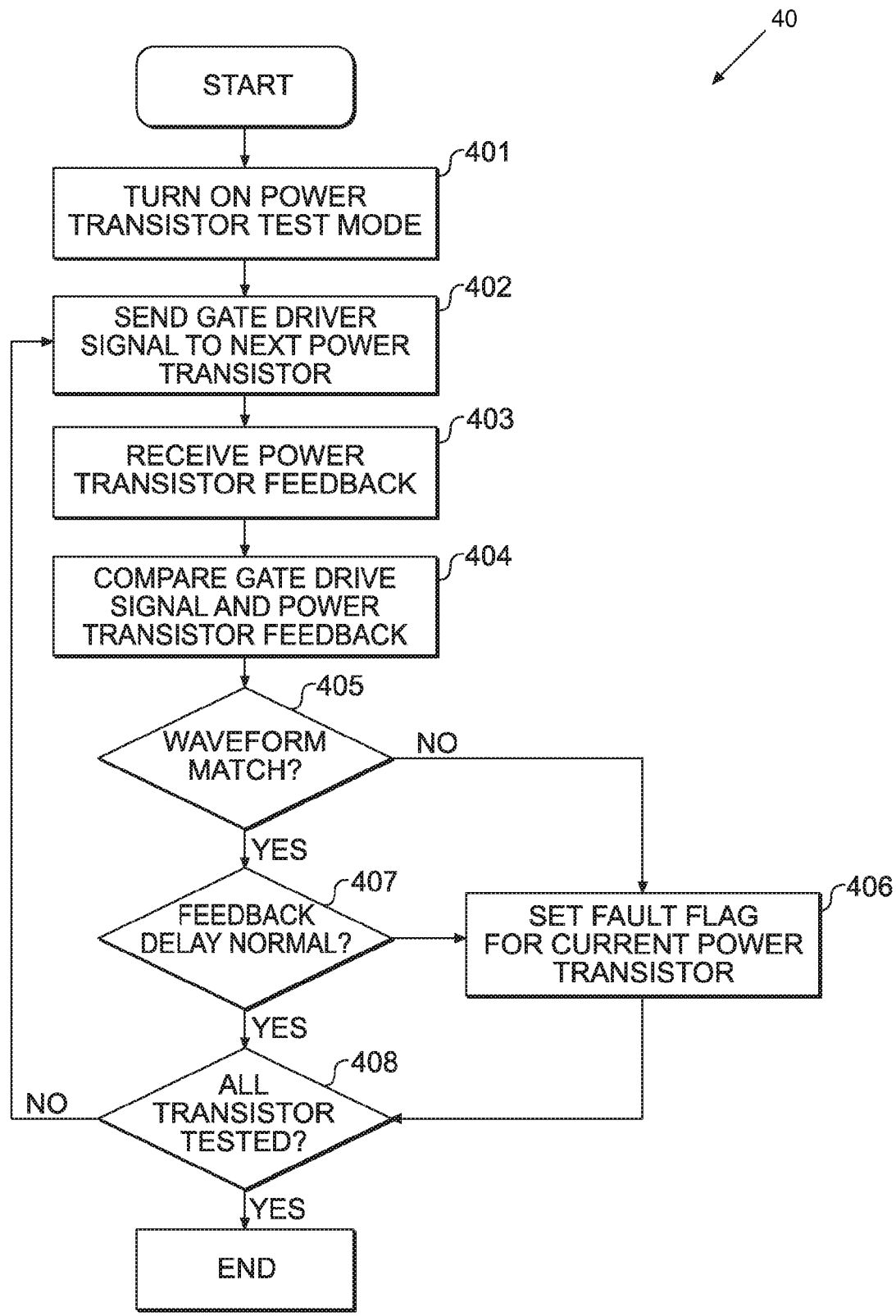
FIG. 4 provides a diagrammatic illustration of an exemplary power transistor test process during a power converter test of FIG. 3, in accordance with an embodiment of the present disclosure.

FIG. 4 provides a diagrammatic illustration of an exemplary operation process 40 of a power transistor test during a power converter test of FIG. 3, in accordance with an embodiment of the present disclosure. When the test begins, controller 220 may be configured to turn on a power transistor test mode (Step 401). Consistent with one embodiment, IGBTs 21-26 may be tested sequentially. A test signal may be first sent to gate driving circuit 201 and a gate driver signal 28 may be applied to the gate terminal of IGBT 21 (Step 402). Controller 220 may be configured to receive a feedback signal 29 from IGBT 21 (Step 403).

Controller 220 may be configured to compare gate driver signal 28 and feedback signal 29, and determine a difference between gate driver signal 28 and feedback signal 29 associated with IGBT 21 (Step 404). For example, the difference may include a waveform difference and a time delay $\tau$ between the two signals. The controller may further operate to compare the difference with a threshold profile. The threshold profile may include a threshold of waveform difference and a threshold of delay time.

Controller 220 may be configured to determine whether the waveform of gate driver signal 28 matches the waveform of feedback signal 29, i.e., whether the difference between the waveform of gate driver signal 28 and the waveform of feedback signal 29 is smaller than a threshold (Step 405). If the waveforms do not match (Step 405: No), a power transistor fault may be identified and the corresponding fault flag may be set for IGBT 21 (Step 406). If the waveforms match (Step 405: Yes), controller 220 may further operate to determine whether the feedback delay is normal, i.e., whether the feedback delay τ is smaller than a threshold (Step 407). If the feedback delay exceeds the threshold (Step 407: No), a power transistor fault may be identified and Step 406 may be executed.

If the feedback delay is normal (Step 407: Yes), IGBT 21 is determined as normal, and controller 220 may be configured to determine whether all IGBTs 21-26 are tested (Step 408). If there is still at least one IGBT not tested (Step 408: No), controller 220 may be configured to repeat steps 402-408 to test the next IGBT, until all the IGBTs are tested. Once all IGBTs 21-26 are tested (Step 408: Yes), process 40 may terminate.

FIG. 5 provides a diagrammatic illustration of an exemplary operation process 50 of a power transistor test during a power converter test of FIG. 3, in accordance with an embodiment of the present disclosure. As in the FIG. 4, in this embodiment controller 220 may be configured to turn on a power transistor test mode (Step 501). IGBTs 21-26 may be tested sequentially. A test signal may be first sent to gate driving circuit 201 and a gate driver signal 28 may be applied to the gate terminal of IGBT 21 (Step 502). Controller 220 may be configured to receive a feedback signal 29 from IGBT 21 (Step 503).

Controller 220 may be configured to compare gate driver signal 28 and feedback signal 29, and determine a difference between gate driver signal 28 and feedback signal 29 associated with IGBT 21 (Step 504). For example, the difference may include a waveform difference and a time delay τ between the two signals. The controller may further operate to compare the difference with a threshold profile. The threshold profile may include a threshold of waveform difference and a threshold of delay time. Controller 220 may be configured to determine whether the waveform of gate driver signal 28 matches the waveform of feedback signal 29, i.e., whether the difference between the waveform of gate driver signal 28 and the waveform of feedback signal 29 is smaller than a threshold (Step 505).

If the waveforms do not match (Step 505: No), controller 220 may be configured to determine if the feedback signal 29 has a zero waveform (Step 506). This means checking if the feedback signal 29 has zero amplitude over a predetermined period of time. The predetermined period of time could be, for example, a full signal switch period, or any other period of time sufficient to indicate with confidence to one of skill in the art that feedback signal 29 has zero amplitude. To account for signal noise, the feedback signal 29 may also be considered to have a zero waveform if the signal amplitude is below a threshold over the predetermined period of time.

If the feedback signal 29 has a zero waveform (Step 506: Yes), controller 220 an open circuit fault may be identified and corresponding fault flag may be set for IGBT 21 (Step 507). An open circuit fault may be indicative of faulty wiring and or a short to ground on the communication line for feedback signal 29. If the feedback signal 29 does not have a zero waveform (Step 506: No), a power transistor fault may be identified and the corresponding fault flag may be set for IGBT 21 (Step 508).

If the waveform of the gate driver signal 28 matches the waveform of the feedback signal 29, controller 220 may further operate to determine whether the feedback delay is normal, i.e., whether the feedback delay τ is smaller than a threshold (Step 509). If the feedback delay exceeds the threshold (Step 509: No), a power transistor fault may be identified and Step 508 may be executed.

If the feedback delay is normal (Step 509: Yes), IGBT 21 is determined as normal, and controller 220 may be configured to determine whether all IGBTs 21-26 are tested (Step 510). Once all IGBTs 21-26 are tested (Step 510: Yes) process 50 may terminate.

It should be noted that process 50 may be configured without an iterative loop to test each and every one of IGBTs 21-26. For example, in the event of an open circuit fault (Step 507) or a power transistor fault (Step 508), process 50 may set the appropriate fault flags and generate an appropriate operator warning, if applicable. For example, if an open circuit fault may indicate that a wiring harness from the inverter is not connected or damaged, it may not be necessary to attempt a test on each of individual IGBTs 21-26. Likewise, it may be desirable in some circumstances to terminate testing and to generate an appropriate operator warning in the event of a power transistor fault without necessitating additional testing, at that time, for additional power transistor faults.

Figure 6A:
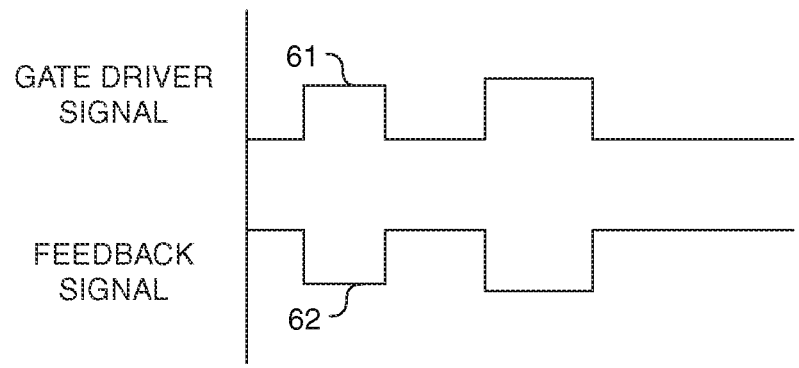
FIG. 6 provides an illustration of exemplary gate driver signals and feedback signals in accordance with an embodiment of the present disclosure.

FIG. 6 shows pairs of exemplary gate driver signals and feedback signals which may indicate various conditions to enable the methods and systems disclosed in the present disclosure to provide the appropriate indication of the state of an inverter. FIG. 6a shows an exemplary gate driver signal 61 with a corresponding feedback signal 62. In this example, feedback signal 62 is a non zero waveform which matches the waveform of gate driver signal 61. FIG. 6a shows feedback signal 62 as displayed without an associated time delay. As previously noted, systems and methods in accordance with the present disclosure may take into consideration the delay in receiving a feedback signal after a gate driver signal is sent. In FIG. 6a, because feedback signal 62 has matching waveform to gate driver signal 61, this may indicate that the IGBT in question is functioning properly.

Figure 6B:
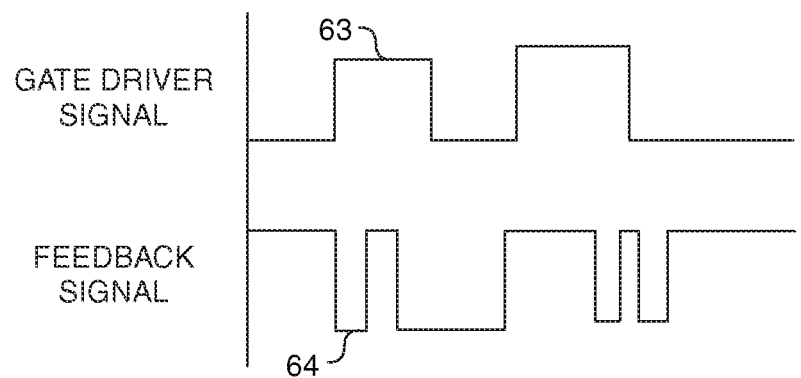

FIG. 6b shows a gate driver signal 63 with a corresponding feedback signal 64. Feedback signal 64 has a non-zero waveform, however, the waveform of feedback signal 64 clearly does not match the waveform of gate driver signal 63. In this case, the presence of a non-matching, non-zero waveform for feedback signal 64 may indicate a power transistor fault.

Figure 6C:
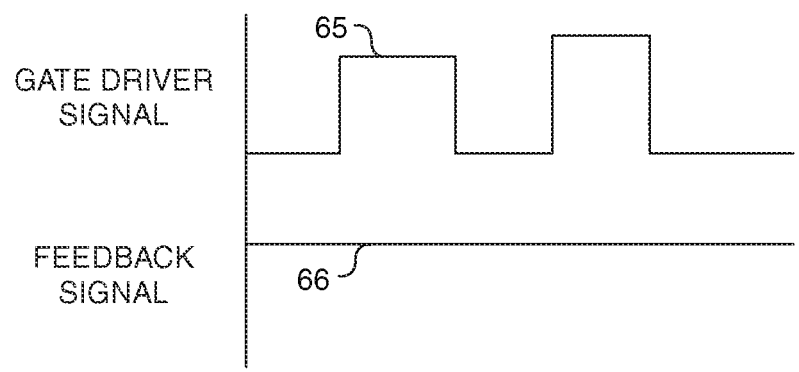

FIG. 6c shows a gate driver signal 65 with a corresponding feedback signal 66. In this example, feedback signal 66 has a zero waveform. This may indicate an open circuit fault. As shown, both FIG. 6b and FIG. 6c may indicate a fault condition. However, the differing nature of feedback signal 64 and feedback signal 66 may provide further indication to the testing system and/or to an operator of the nature of the fault, i.e., whether the fault is an open circuit fault (e.g., a faulty wiring connection to the inverter or an inverter component) or a power transistor fault (e.g., a transistor that is not functioning within expected or tolerated limits).

Power transistor testing system 150 in the present disclosure may provide increased reliability over conventional power transistor testing systems, such as the one disclosed in the '988 patent. For example, the disclosed power transistor testing system 150 may identify and diagnose faults associated with power transistors, their driving circuits, and wirings before high voltage is applied. Therefore, no current flow is conducted, so that in an event of power transistor fault, no other components connected in the circuit will be damaged. Furthermore, different from the testing system described in the '988 patent, the disclosed power transistor testing system 150 may include a diagnosis tool in controller 220 and operate to determine the type and location of the fault. In addition, once a fault is detected, the disclosed power transistor testing system 150 may disable inverter/converter functionality, until the fault is cleared.

It will be apparent to those skilled in the art that various modifications and variations can be made to the disclosed power transistor testing system without departing from the scope of the disclosure. Other embodiments of the present disclosure will be apparent to those skilled in the art from consideration of the specification and practice of the present disclosure. It is intended that the specification and examples be considered as exemplary only, with a true scope of the present disclosure being indicated by the following claims and their equivalents.

What is claimed is:

1. A method for testing a power converter having at least one power transistor, comprising:
   receiving a power transistor test request;
   resetting a fault flag for each power transistor, wherein the fault flag indicates a fault status associated with a corresponding power transistor;
   applying a gate driver signal to each power transistor;
   receiving a feedback signal from each power transistor;
   determining a difference between the gate driver signal and the feedback signal associated with a respective power transistor;
   determining whether the feedback signal received is a non-zero waveform over a predetermined period of time; and
   identifying a power transistor fault if the difference exceeds a threshold profile and the feedback signal received is a non-zero waveform over the predetermined period of time.

2. The method of claim 1, further including identifying an open circuit fault if the difference exceeds a threshold profile and the feedback signal received is a zero waveform over the predetermined period of time.

3. The method of claim 1, further including setting the fault flag for the power transistor on which a power transistor fault is identified.

4. The method of claim 1, wherein the predetermined period of time is a full signal switch period.

5. The method of claim 1, wherein the test request is initiated by a user via a user interface.

6. The method of claim 1, wherein the test request is initiated at the start of a machine.

7. The method of claim 1, wherein resetting a fault flag further includes disabling an operation of the power converter.

8. The method of claim 1, wherein the difference includes a difference between a waveform of the gate driver signal and a waveform of the feedback signal.

9. The method of claim 1, wherein the difference includes a time delay between the gate driver signal and the feedback signal.

10. The method of claim 1, wherein identifying the power transistor fault further includes diagnosing the power transistor fault and determining a type and a location of the fault.

11. The method of claim 7, wherein the type of the fault includes at least one of a device fault, a driving circuit fault, and a wiring fault.

12. The method of claim 1, wherein the at least one power transistor is an insulated gate bipolar transistor.

13. The method of claim 3, wherein setting the fault flag further includes:
   generating a test report having a fault advisory message; and
   displaying the test report on a display device.

14. The method of claim 13, wherein the fault advisory message contains information associated with a type and a location of each power transistor fault.

15. The method of claim 3, wherein setting the fault flag further includes providing at least one warning indication in response to a power transistor fault.

16. The method of claim 1, further including enabling an operation of the power converter if no fault is identified.

17. A power transistor testing system, comprising:
   a controller electrically coupled to a power converter, and being configured to:
      reset a fault flag for each power transistor, wherein the fault flag indicates a fault status associated with a corresponding power transistor;
      apply a gate driver signal to each power transistor;
      receive a feedback signal from each power transistor;
      determine a difference between the gate driver signal and the feedback signal associated with a respective power transistor;
      determine whether the feedback signal received is a non-zero waveform over a predetermined period of time; and
      identify a power transistor fault if the difference exceeds a threshold profile and the feedback signal received is a non-zero waveform over the predetermined period of time; and
   a display device coupled to the controller, and being configured to provide at least one warning indication in the event of a power transistor fault.

18. The power transistor testing system of claim 17, wherein the controller is further configured to identify an open circuit fault if the difference exceeds a threshold profile and the feedback signal received is a zero waveform over the predetermined period of time.

19. The power transistor testing system of claim 18, wherein the display device is further configured to provide at least one warning indication in the event of an open circuit fault.

20. The power transistor testing system of claim 17, further including a user interface, configured to:
   receive a power transistor test request; and
   receive a threshold profile for each power transistor.

21. The power transistor testing system of claim 17, wherein the difference includes a difference between a waveform of the gate driver signal and a waveform of the feedback signal.

22. The power transistor testing system of claim 17, wherein the difference includes a time delay between the gate driver signal and the feedback signal.

23. The power transistor testing system of claim 17, wherein the controller is further configured to:
   diagnose power transistor fault and determining a type and a location of the fault; and
   generating a test report having a fault advisory message which contains the type and the location of the fault.

24. The power transistor testing system of claim 23, wherein the display device is further configured to display the test report.

25. A machine, comprising:
a power source;
at least one power converter, each power converter having at least one power transistor; and
a power transistor testing system electrically coupled to the at least one power converter, wherein the power transistor testing system includes:
 a controller electrically coupled to the at least one power converter, and being configured to:
  apply a gate driver signal to each power transistor;
  receive a feedback signal from each power transistor;
  determine a difference between the gate driver signal and the feedback signal associated with a respective power transistor; and
  determine whether the feedback signal received is a non-zero waveform over a predetermined period of time;
  identify a power transistor fault if the difference exceeds a threshold profile and the feedback signal received is a non-zero waveform over the predetermined period of time; and
 a display device configured to provide at least one warning indication if a power transistor fault is detected.

26. The machine of claim 25, wherein the controller is further configured to identify an open circuit fault if the feedback signal received is a zero waveform over the predetermined period of time.

27. The machine of claim 26, wherein the display device is configured to provide at least one warning indication if an open circuit fault is detected.

28. The machine of claim 25, wherein the power transistor testing system further includes a user interface configured to:
receive a power transistor test request; and
receive a threshold profile for each power transistor.

* * * * *